(12) United States Patent
Butt et al.

(10) Patent No.: US 7,056,628 B2
(45) Date of Patent: Jun. 6, 2006

(54) MASK FOR PROJECTING A STRUCTURE PATTERN ONTO A SEMICONDUCTOR SUBSTRATE

(75) Inventors: Shahid Butt, Ossining, NY (US); Henning Haffner, Dresden (DE)

(73) Assignee: Infineon Technologies AG, Munich (DE)

( * ) Notice: Subject to any disclaimer, the term of this patent is extended or adjusted under 35 U.S.C. 154(b) by 250 days.

(21) Appl. No.: 10/653,537

(22) Filed: Sep. 2, 2003

(65) Prior Publication Data
US 2004/0131950 A1  Jul. 8, 2004

(30) Foreign Application Priority Data
Sep. 2, 2002  (DE) ............................... 102 40 403

(51) Int. Cl.
*G01F 9/00*  (2006.01)
(52) U.S. Cl. ............................................ 430/5
(58) Field of Classification Search .................. None
See application file for complete search history.

(56) References Cited

U.S. PATENT DOCUMENTS

| 5,242,770 | A | 9/1993 | Chen et al. |
| 6,197,452 | B1 | 3/2001 | Matumoto |
| 6,569,584 | B1 * | 5/2003 | Ho et al. ................... 430/5 |
| 6,839,890 | B1 * | 1/2005 | Sugita et al. ............. 716/19 |

* cited by examiner

*Primary Examiner*—S. Rosasco
(74) *Attorney, Agent, or Firm*—Laurence A. Greenberg; Werner H. Stemer; Ralph E. Locher

(57) ABSTRACT

A mask is configured for projecting a structure pattern onto a semiconductor substrate in an exposure unit. The exposure unit has a minimum resolution limit for projecting the structure pattern onto the semiconductor substrate. The mask has a substrate, at least one raised first structure element on the substrate which has a lateral extent which is at least the minimum lateral extent that can be attained by the exposure unit, a configuration second raised structure elements which are arranged in an area surrounding the at least one first structure element on the substrate in the form of a matrix with a row spacing and a column spacing, whose shape and size are essentially identical to one another, and which have a respective lateral extent that is less than the minimum resolution limit of the exposure unit.

15 Claims, 2 Drawing Sheets

MASK FOR PROJECTING A STRUCTURE PATTERN ONTO A SEMICONDUCTOR SUBSTRATE

BACKGROUND OF THE INVENTION

Field of the Invention

The invention lies in the semiconductor technology and manufacturing field. More specifically, the invention relates to a mask for projecting a structure pattern onto a semiconductor substrate in an exposure unit. The exposure unit has a minimum resolution limit defining a minimum attainable lateral extent for a structure pattern element which is to be projected onto the semiconductor substrate.

Structures are formed on a semiconductor substrate usually by means of projection of a structure pattern from a mask onto the semiconductor substrate. This is done via a lens system in an exposure unit. In order to ensure the quality of a mapping operation and the functionality of the integrated circuit which is to be produced, the process involves prescribing a tolerance by which the lateral extent of the structure formed on the semiconductor substrate may differ from that on the projected mask or design master taking into account a reduction factor for the mapping.

Free parameters available when carrying out a projection in an exposure unit are, by way of example, the exposure dose and the setting of a focus value for the lens system in question. Generally, what is obtained is a number of combinations for the two aforementioned exposure parameters, for which a difference, which can be measured using a microscope, for example, is smaller than the prescribed tolerance value. A two-dimensional range for the combinations which satisfy such a condition is also called a process window.

For a fixed exposure dose, a range of admissible focus values for the exposure is available as a section through this process window. This range, which is also referred to as the depth of field, ideally has a large extent. This is because, firstly, with a large number of preliminary processes, a complicated surface topography may already have been produced on the semiconductor substrate by forming a corresponding number of levels in a circuit. Accordingly, it must be possible to carry out mapping at various levels, but in one mapping operation, in each case with high definition.

Secondly, by way of example, lens aberrations over the image plane of the semiconductor substrate bring about a distribution of differences in the local focus value with respect to a mean value for the focus. The differences (defocus) cannot be corrected without adversely affecting the other regions in the image plane.

Modern techniques for improving the resolution for projection, "lithographic resolution enhancement techniques", equally result in a disadvantageous reduction in the depth-of-field range if they are intended to be used to transfer structure elements in the neighborhood of the resolution limit of the exposure unit to the image plane. These techniques include, by way of example, the use of off-axis illumination (OAI) or the use of half-tone phase masks.

Since reducing the resolution limit is aimed particularly at projecting particularly dense structures, as in memory production, for example, the problem of the depth-of-field range being too small arises particularly for structure elements which are arranged on the substrate in isolated fashion. This is because lens aberrations and the respective illumination setting used, for example off-axis illumination or particular aperture shapes, have different effects on densely arranged and isolated structure elements.

As a solution, various other techniques have been proposed, among which, by way of example, the alternating phase masks can be mentioned which, on account of their properties, have only an insignificant influence on the depth-of-field range in relation to the isolated structures. However, they are very complex to produce and usually require double exposures, which signifies a considerable increase in the expense of the overall production process.

Another solution is to carry out double exposure for respective dense structures and for the isolated structure elements in the peripheral region. This results in an increased cost outlay and possibly in a reduction in quality on account of additional alignment to be carried out during exposure.

Another solution involves arranging "sublithographic structures" (subresolution assist features (SRAF)) in the immediate surroundings of the isolated structure elements on the mask. These sublithographic structure elements have a lateral extent which is smaller than the minimum lateral extent which can be attained with the exposure unit. They are thus not mapped on the semiconductor substrate under normal exposure conditions. Their proximity to the isolated structure means that the sublithographic structure element delivers a light and phase contribution to the mapping of the isolated structure, however, similarly to the way in which this would bring about adjacent structure elements within a dense structure configuration, for example. The sublithographic structure elements therefore simulate a dense structure configuration around the isolated structure element.

One drawback of this solution is that the allocation and dimensioning of these sublithographic structure elements as auxiliary structures for isolated structure elements require complicated computation methods to be carried out taking into account the circuit's design rules. The design rules include conditions which need to be used to match the position and distances of structure elements to one another over a plurality of circuit levels. Another drawback is the increased sensitivity to the "mask error enhancement factor" (MEF), which describes a nonlinear, very acutely increasing relationship between the difference in the lateral extents of structures on the mask and the order of magnitude of the difference in the lateral extent of the same structures on the semiconductor substrate actually in the region of the resolution limit, i.e. the minimum lateral extent which can be obtained by the exposure unit. Yet another drawback is the significant reduction in the resolution with which structures are produced on the mask in binary form. The small extent of the sublithographic structure elements means that this resolution needs to be chosen to be particularly small, which significantly increases the writing time and hence the cost outlay for producing the mask.

SUMMARY OF THE INVENTION

It is accordingly an object of the invention to provide a mask for projecting a structural pattern onto a semiconductor substrate which overcomes the above-mentioned disadvantages of the heretofore-known devices and methods of this general type and which specifies a mask that increases the depth-offield range for projecting a mask onto a semiconductor substrate as compared with conventional masks or phase masks. It is also an object of the present invention to improve the size accuracy of a mapping operation for structure elements in dense structure configurations and also isolated structure elements during projection onto the semiconductor substrate.

With the foregoing and other objects in view there is provided, in accordance with the invention, a mask for projecting a structure pattern onto a semiconductor substrate in an exposure unit, the exposure unit having a minimum resolution limit for projecting the structure pattern onto the semiconductor substrate. The mask has the following features:

a substrate;

at least one raised first structure element on the substrate, the first structure element having a lateral extent amounting to at least the minimum resolution limit;

a configuration of raised second structure elements, the second structure elements:

being disposed in a vicinity of the first structure element on the substrate and arranged in a matrix with a row spacing and a column spacing;

having a substantially identical shape and size; and having a respective lateral extent less than the minimum resolution limit, so that the structure configuration cannot be transferred to a photosensitive resist layer formed on the semiconductor substrate.

In other words, the above object is achieved with a mask for projecting a structure pattern onto a semiconductor substrate in an exposure unit, the exposure unit having a minimum resolution limit for a structure pattern element projected onto the semiconductor substrate, comprising substrate, at least one raised first structure element on the substrate, which has a lateral extent which is at least the minimum lateral extent which can be attained by the exposure unit, an arrangement of second raised structure elements, which are arranged in an area surrounding the at least one first structure element on the substrate in the form of a matrix with a row spacing and a column spacing, whose shape and size are essentially identical to one another, and which have a respective lateral extent which is less than the minimum lateral extent which can be attained by the exposure unit.

With the above and other objects in view there is also provided, in accordance with the invention, a mask blank for producing the above-outlined mask. The mask blank includes the following:

a substrate;

a first layer having a matrix configuration of structure elements on the substrate; and a second opaque or semitransparent layer for forming first structure elements on the mask disposed above the first layer.

In other words, the object is also achieved by a mask blank for producing the mask. The mask blank comprises a substrate, a first layer with a matrix-like arrangement of structure elements which are arranged on the substrate, a second opaque or semitransparent layer for forming first structure elements on the mask, which is arranged above the first layer with the filling material.

The minimal resolution limit of the exposure unit corresponds in this case to a minimum lateral extent which can be attained for a structure pattern element projected onto the semiconductor substrate on a mask.

In line with one advantageous refinement, a filling material is arranged in the interspaces in the matrix-like arrangement.

Furthermore, the objects of the invention are also achieved method for producing the mask from the mask blank and by utilizing the mask blank to produce the mask.

In line with the present invention, the area surrounding a preferably isolated structure element with a lateral extent situated above the resolution limit of the exposure system is provided with a matrix-like arrangement of sublithographic structure elements. The resolution limit of the projection system corresponds to the minimum lateral extent which can be attained for structures on the semiconductor substrate using the exposure unit. This is dependent on the properties of the exposure unit, particularly the exposure settings, the wavelength used for the structuring light or particle beam (electron, ion, EUV, UV and visual beam), the lens system, and also on the properties of the mask and of the semiconductor substrate, particularly on the photosensitive resist used.

The sublithographic structure elements have a lateral extent which is smaller than the minimum lateral extent which can be attained using the exposure unit on the semiconductor substrate. The matrix-like structure configuration is thus not formed on the semiconductor substrate as such. The matrix comprises a number of structure elements which are arranged in rows and columns. The structure elements in the rows and columns are at a fixed distance from one another. That is to say that each row in the matrix is at the same distance from a row which is adjacent to it, and each column is at a second distance from a column which is adjacent to it. It is not necessary for the directions of the rows and columns to be at right angles to one another in each case.

The coverage density of the structure configuration is preferably small enough for full exposure over a large area to be produced on the semiconductor substrate at the appropriate position in the photosensitive layer when a positive resist is used.

The shape and size of the sublithographic structure elements are each essentially identical to one another. Provision is also made for the invention to involve sublithographic structure elements with a first shape and a second shape being arranged alternately in a column. The same applies to the rows in the matrix-like structure configurations. As one alternative, such an arrangement can be regarded for the purposes of the invention as two nested matrix-like inventive structure configurations. As another alternative, two adjacent structure elements with different shapes and with a sublithographic lateral extent can be regarded as a respective assembled, inventive, sublithographic structure element and are arranged in enlarged rows and/or columns of a matrix.

The sublithographic structure elements can be respectively connected to one another, for example to form a grid comprising crossing lines. In this case, the crossover points between the lines can be regarded as sublithographic structure elements, for example.

The sublithographic structure elements can be in the form of opaque or semitransparent layer structures.

The advantageous effect of the present invention can be explained in that the periodic pattern, which is arranged over a large area in an area surrounding a structure element arranged so as to be isolated on the substrate, modulates the Fourier transform for the structure pattern on the mask, which pattern is produced particularly at the diaphragm level of the lens system, such that the presence of dense structures producing mapping on the semiconductor substrate is simulated.

Although these portions are not mapped on the semiconductor substrate by the lens system, the structure configuration over a large area advantageously supplies contributions to mapping the structure element arranged in isolated fashion. The isolated structures and the sublithographic structures can be both transparent structures in an opaque or semitransparent surrounding area and opaque or semitransparent structures in a transparent surrounding area.

In line with one advantageous refinement of the present invention, each of the structure elements of the matrix-like structure configuration is situated outside a distance from the structure element arranged in an isolated fashion, which means that the structures of the matrix-like arrangement are not connected to the isolated structure.

Other features which are considered as characteristic for the invention are set forth in the appended claims.

Although the invention is illustrated and described herein as embodied in a mask for projecting a structure pattern onto a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
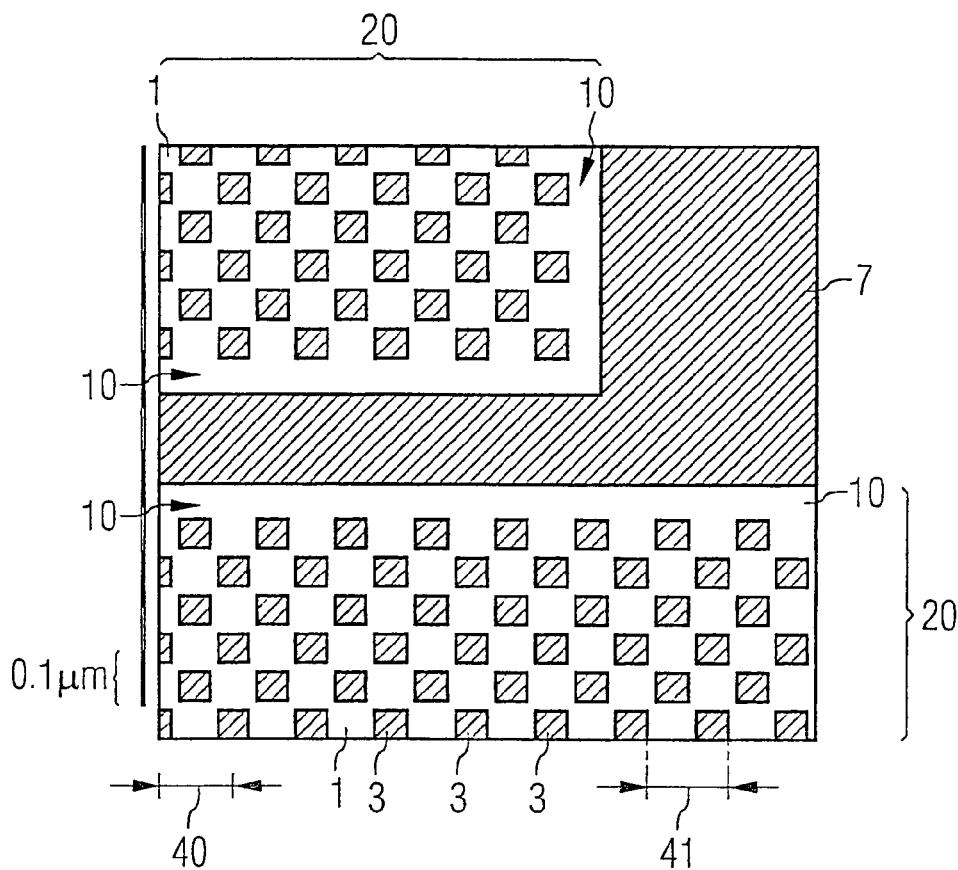
FIG. 1 is a plan view of a detail from a mask with an opaque or semitransparent structure element which is surrounded by a configuration of sublithographic structure elements according to the invention.

Referring now to the figures of the drawing in detail and first, particularly, to FIG. 1 thereof, there is shown a first exemplary embodiment of a mask in accordance with the invention. The figure shows a detail from the surface of the mask with an isolated, opaque or semitransparent structure element 7 which has a planar "pad" structure (top right in FIG. 1) and an "antenna" structure connected thereto (on the left in FIG. 1). The resolution limit, i.e. the minimum lateral extent 40 of a structure element which can be attained on the substrate using the exposure unit used in this case, is 0.13 µm in this example. The left-hand side of FIG. 1 shows a ruler with a 0.1 µm resolution which shows the sizes in relation to the wafer. The actual sizes on the mask are therefore a factor of 4 or 5 larger.

The regions on the substrate 1 which are not taken up by the structure element 7 in the detail shown have structure elements 3 which are grouped into a matrix-like arrangement 20 of structure elements 3 with rows and columns. The structure elements 3 have a square shape with a lateral extent 42 (cf. FIG. 3A) of 0.05 µm. The period 41 of the configuration of structure elements, i.e. the distance between grid points in the matrix, is 0.17 µm. The structure elements 3 are therefore not resolved on the semiconductor wafer by the projection system.

The structure element 7, which produces isolated mapping on the semiconductor substrate, taking into account the lack of mapping for the structure elements 3, is completely surrounded by the configuration of structure elements 3 (shown only partly in FIG. 1). In the immediate surroundings of the structure element 7, a region 10 on the transparent substrate 1 is left free of structure elements 3 in the configuration 20. The region 10 has an extent of 0.075 µm.

Figure 3A:
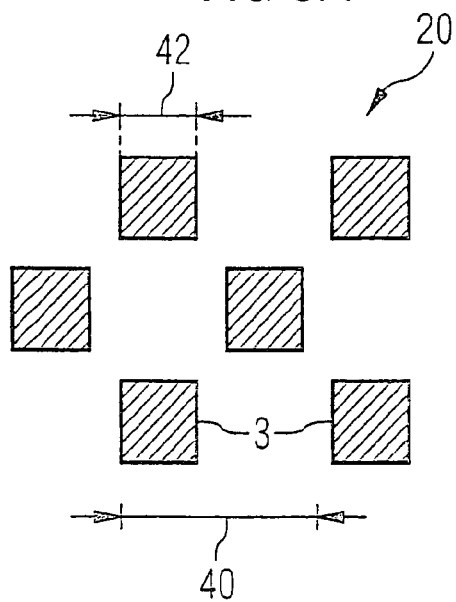
FIGS. 3A and 3B are plan view of examples of structure elements from which the matrix-like structure configuration of sublithographic elements is assembled.
Figure 3B:
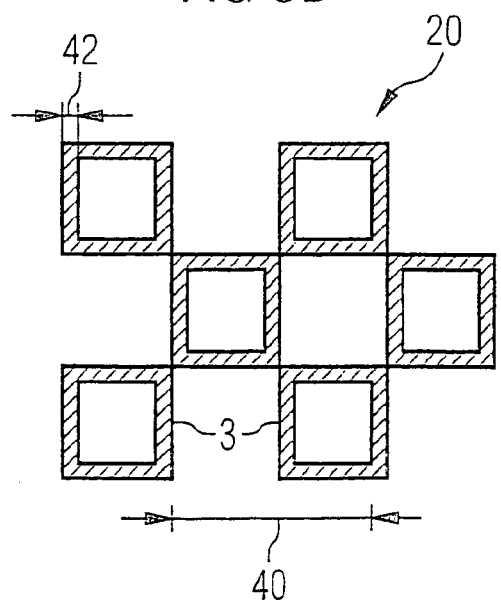

FIG. 3A shows an enlarged illustration of the structure elements 3 shown in FIG. 1 in a square embodiment. The exact shape and size can be chosen as desired, however, remembering to observe the conditions cited at the outset. Another exemplary embodiment is outlined in FIG. 3b. In this case, the sublithographic structure elements 3 are made up of four narrow lines put together to form a square.

The lateral extent 42 which governs any mapping on the semiconductor substrate can be regarded as a cross section of one of the four lines in a square structure element 3. An extent from line to line over the transparent interspace inside the square can therefore, in line with the invention, be situated entirely above the minimum lateral extent 40 which can be obtained by the exposure unit on the semiconductor substrate. A crucial factor is that a lateral extent 42 needs to be present in the structure element 3, below which lateral extent the minimum lateral extent 40 which can be attained by the exposure unit on a semiconductor substrate exists, with the result that the structure element 3 or the entire structure configuration 20 is not formed on the semiconductor substrate.

In line with an exemplary embodiment for producing the mask shown in FIG. 1, an optimum shape or size for the structure element 3 is first obtained by means of simulation or experiment, i.e. by means of test exposures. At the same time, the optimum distance between the structure configuration 20 in question and the isolated structure element 7 is also determined, which is chosen to be constant at all edges of the structure element in a preferred embodiment. In the same way, the orientations and distances for the columns and rows in the matrix of the structure configuration 20 need to be determined.

In another step, suitable software is used to integrate the structure configurations 20 into the layout data for the circuit which is to be produced. If the aim is to fill up those regions of the surface of the substrate 1 which are left free of isolated structure elements 7 with structure configurations over the entire area, then the filling process starts in the layout data close to the edges of the isolated structure elements 7. Starting from these in each case, geometric conflicts, for example the situation that, with two structure configurations impinging on one another, space is available on the surface only for half a column spacing, are solved by virtue of jumps in the respective arrangements, where possible in the center between two isolated structure elements 7. As a result, the distance between these discontinuities and the structure elements 7 is chosen at the maximum.

Accordingly, optionally OPC structures are added to the layout or OPCs are integrated onto the structure elements 7, taking into account the presence of the structure configurations 20. With layout data in such a form, a mask writer, such as an electron beam writing unit or a laser writing unit, can now be used to produce the mask. In a similar manner to with conventional masks, inspection and, if appropriate, repairs are carried out using sublithographic auxiliary structure elements.

The advantage in the case of this exemplary embodiment is the automatic addition of a sublithographic structure element 3 having the same respective shape, size, distance under criteria which are objective and can therefore be used for use in a software programmer. The homogeneity of the structure configurations 20 from the filling process means that mask inspection is also much easier than, by way of example, in the case of individually assigned auxiliary structures, such as scatter bars, which are often classified as faults.

Another advantage is that a given design for structure configurations 20 satisfies a large number of different settings for the illumination of the mask such that they can each be used for the same mask. The result of this is increased flexibility for the illumination.

The increased, more homogeneous density of coverage on the mask also gives rise to advantages for etching processes which need to be performed on the mask when producing it.

Another exemplary embodiment for producing the inventive mask is shown in FIG. 2. In this case, a special mask blank is provided, as illustrated in the cross-sectional profile in FIG. 2A. Arranged on a substrate 1 is a first layer 2 which comprises a full-area structure configuration 20 of sublithographic structure elements 3. The structure elements 3 comprise molybdenum silicide as a material. When the structures are exposed, they are semitransparent to irradiated light.

The interspaces 4 in the first layer 2 are filled with an oxide and/or a nitride, so that the first layer 2 has a planar surface. Generally, however, a nonplanar surface is also entirely possible. Instead of the oxide and/or nitride, another material can also be selected which can be removed selectively with respect to the molybdenum silicide. Ideally, the filling material has similar optical properties to the material in the first layer—but with a higher etching selectivity toward the layer, so that the filling material can easily be removed without impairing the first layer.

A further layer 5 is disposed on the first layer 2. The further layer 5 is formed of molybdenum silicide, and a chromium layer 6 is disposed on the layer 5. This mask blank is used to produce a half-tone phase mask as described below.

Figure 2A:
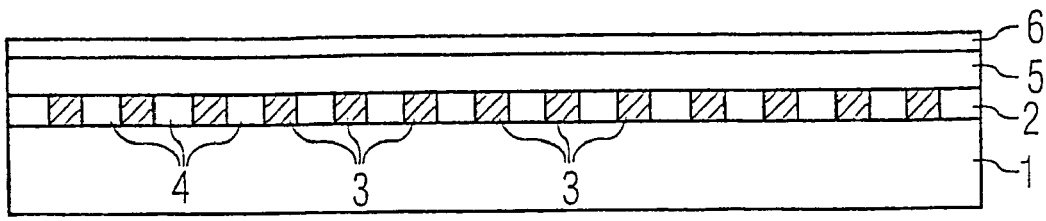
FIGS. 2A–2D are sectional views illustrating sequential process steps for producing the mask according to the invention from a mask blank with a separate layer set up specifically for the configuration of sublithographic structure elements.
Figure 2B:
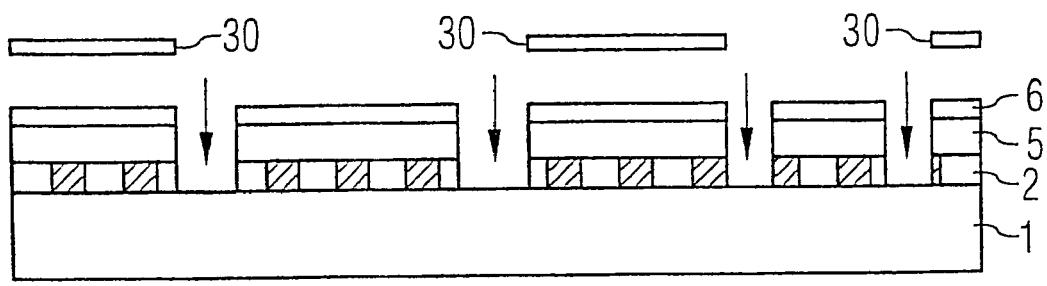

FIG. 2B shows the formation of a region or frame, which is free of structure elements 3, in the immediate surroundings of the positions 30 of the isolated structure elements 7 which are to be formed in a subsequent step. This involves the successive removal of the chromium layer 6, of the further layer comprising molybdenum silicide and of the second layer with the filling material and the structure elements 3 in the region 10 by means of etching.

Figure 2C:
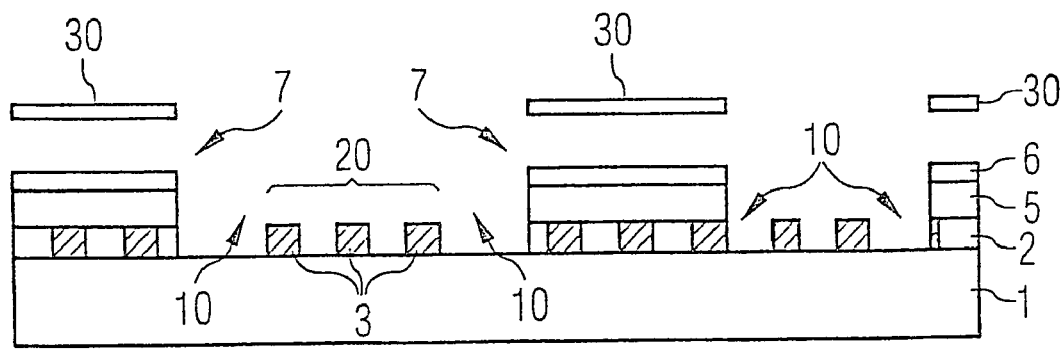

FIG. 2C shows, as the next step, the removal of the chromium layer 6, of the further layer 5 comprising molybdenum silicide and of the filling material in the interspaces 4 in order to form the raised structure elements 7. The structure elements 3 situated outside the regions 10 are now not removed any more, however. They form the inventive structure configuration 20, which has a matrix shape for the structure elements 3.

Figure 2D:
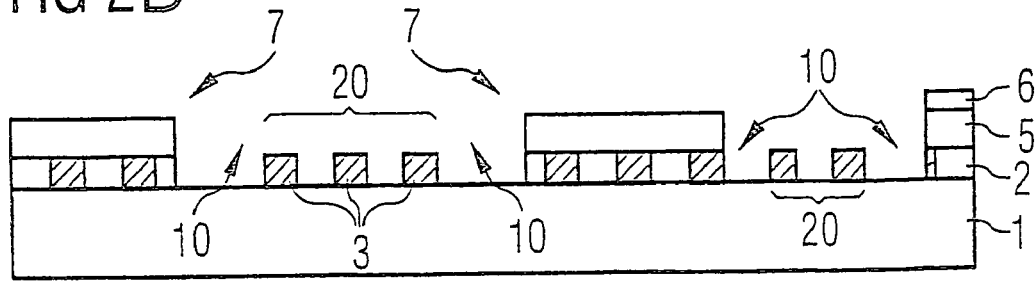

FIG. 2D shows the step for forming the half-tone phase mask by etching the thin chromium layer on the structure elements 7. Like the sublithographic structure elements 3, the isolated structure elements 7 are now in a semitransparent form. The step of chromium etching can be carried out using a mask, which means that further structure elements 7 exist which are opaque. It should be particularly emphasized that, in line with this exemplary embodiment, further sublithographic structure elements 3, which remain unused, are situated in the first layer, hidden beneath the structure elements 7.

We claim:

1. A mask for projecting a structure pattern onto a semiconductor substrate in an exposure unit, the exposure unit having a minimum resolution limit for projecting the structure pattern onto the semiconductor substrate, the mask comprising:
    a substrate;
    at least one raised first structure element on said substrate, said first structure element having a lateral extent amounting to at least the minimum resolution limit, said first structure element formed of a first layer and a second layer, said first layer and said second layer selected from the group consisting of opaque layers and semitransparent layers;
    a configuration of raised second structure elements, said second structure elements:
        being disposed in a vicinity of said first structure element on said substrate and arranged in a matrix with a row spacing and a column spacing;
        being formed by only said first layer;
        having a substantially identical shape and size; and
        having a respective lateral extent less than the minimum resolution limit, so that the structure configuration cannot be transferred to a photosensitive resist layer formed on the semiconductor substrate.

2. The mask according to claim 1, wherein said at least one raised first structure element is surrounded by said matrix of said second structure elements.

3. The mask according to claim 1, wherein said at least one raised first structure element is disposed with a spacing distance from each of said raised second structure elements in said matrix.

4. The mask according to claim 1, wherein at least one of said second structure elements formed of said first layer being an opaque layer.

5. The mask according to claim 1, wherein at least one of said second structure elements formed of said first layer being a semitransparent layer.

6. The mask according to claim 1, wherein:
    said first structure element and said second structure elements are formed on a surface of the mask; and
    said matrix of said second structure elements surrounds said first structure elements and fills up an entire area of the surface.

7. A mask blank for producing the mask according to claim 1, comprising:
    a substrate;
    a first layer having a matrix configuration of structure elements on said substrate; and
    a second opaque or semitransparent layer for forming first structure elements on the mask disposed above said first layer.

8. The mask blank according to claim 7, which comprises a filling material disposed in interspaces formed in said matrix configuration.

9. The mask blank according to claim 7, which further comprises a third semitransparent layer disposed between said first layer and said second layer.

10. The mask blank according to claim 7, wherein said first layer with said matrix configuration of structure elements comprises molybdenum silicide.

11. The mask blank according to claim 8, wherein said filling material in said interspaces includes at least one material selected from the group consisting of an oxide and a nitride.

12. The mask blank according to claim 8, wherein said filling material and a material in said first layer have similar optical properties.

13. The mask blank according to claim 12, wherein the similar optical properties include transparency and phase shift properties.

14. A method of producing a mask, which comprises:
providing a mask blank with:
  a substrate;
  a first layer having a matrix configuration of structure elements on the substrate; and
  a second opaque or semitransparent layer for forming first structure elements on the mask disposed above said first layer;
and producing the mask according to claim 1 from the mask blank.

15. A method of producing a mask for projecting a structure pattern onto a semiconductor substrate in an exposure unit, the exposure unit having a minimum resolution limit for projecting the structure pattern onto the semiconductor substrate, the method which comprises:
providing a mask blank according to claim 7; and
processing the mask blank to produce a mask having:
  the substrate;
  at least one raised first structure element on the substrate, the first structure element having a lateral extent amounting to at least the minimum resolution limit;
  a configuration of raised second structure elements, the second structure elements:
    being disposed in a vicinity of the first structure element on the substrate and arranged in a matrix with a row spacing and a column spacing;
    having a substantially identical shape and size; and
    having a respective lateral extent less than the minimum resolution limit, so that the structure configuration cannot be transferred to a photosensitive resist layer formed on the semiconductor substrate.

* * * * *